United States Patent [19]
Ten Pierick et al.

[11] Patent Number: 4,891,565
[45] Date of Patent: Jan. 2, 1990

[54] FIELD DEFLECTION CIRCUIT IN A PICTURE DISPLAY DEVICE

[75] Inventors: Hendrik Ten Pierick; Edward M. Ponte, both of Eindhoven; Alko F. E. De Vries, Arnhem, all of Netherlands

[73] Assignee: U. S. Philips Corporation, New York, N.Y.

[21] Appl. No.: 211,306

[22] Filed: Jun. 24, 1988

[30] Foreign Application Priority Data

Jul. 17, 1987 [NL] Netherlands ............................ 8701692

[51] Int. Cl.⁴ ........................ H01J 29/70; H04N 5/04
[52] U.S. Cl. ..................................... 315/408; 358/148
[58] Field of Search ............. 315/329, 403, 408–410; 358/242, 180, 148, 154, 158; 377/39; 364/719; 340/146.2; 307/228

[56] References Cited

U.S. PATENT DOCUMENTS 4,228,461 10/1980 Weissmueller ...................... 358/148
4,334,174  6/1982 Weissmueller ...................... 315/408

Primary Examiner—Thomas H. Tarcza
Assistant Examiner—Gregory C. Issing
Attorney, Agent, or Firm—Edward W. Goodman

[57] ABSTRACT

A field deflection circuit in a picture display device including a sawtooth generator for generating an essentially sawtooth-shaped voltage. The circuit is provided with a storage element in which information is stored under the influence of applied clock pulses. Per field period the number of times when the content of the storage element is changed is reduced to a predetermined number, e.g. because a number of clock pulses is omitted. The clock pulses applied to the sawtooth generator are then distributed as regularly as possible.

12 Claims, 2 Drawing Sheets

FIELD DEFLECTION CIRCUIT IN A PICTURE DISPLAY DEVICE

BACKGROUND OF THE INVENTION

The invention relates to a circuit for the field deflection in a picture display device suitable for receiving and processing a signal comprising line and field pulses, the field deflection circuit comprising a sawtooth generator, a power amplifier coupled to the sawtooth generator, and a field deflection coil connected to an output of the amplifier, and a clock pulse generator for applying clock pulses to the sawtooth generator, the sawtooth generator, for generating an essentially sawtoothshaped signal, being provided with a storage element for storing information under the influence of applied clock pulses and having reset means for resetting the storage elements under the influence of field pulses.

A circuit of this type is known from British patent application 2,095,491. In this known circuit an essentially sawtooth-shaped signal is generated wherein charges are applied to a capacitor as a result of the occurrence of clock pulses and wherein under the influence of a field-frequency reset pulse, the charge level is each time reduced to a given value. In fact, a staircase-shaped signal is generated but the sawtooth shape required for the vertical deflection is obtained in that the height of the separate steps is very small as compared with the total amplitude of the stair-case and in that smoothing means are used. Since the number of charges per field period has a predetermined value, the amplitude of the generated voltage is constant.

The known circuit also includes a phase control loop for controlling the frequency of the clock pulse generator. If the field frequency in the incoming signal changes, the control loop adjusts itself after some time in such a manner that the clock pulse frequency is a multiple of the field frequency while the amplitude of the sawtooth remain unchanged. In view of the very low value of the field frequency, such a control is, however, very slow and may give rise to instability at the instant of change. In addition, the control loop includes capacitors having a large capacitance which are not integratable in an integrated circuit. In an integrated circuit having most components of the circuit, a plurality of connection terminals must be reserved for this purpose.

SUMMARY OF THE INVENTION

It is also an object of the invention to provide a circuit in which the amplitude of the generated sawtooth and hence the picture height is constant, but without using a feedback control and without any additional capacitors with their associated connection terminals being required. To this end a field deflection circuit according to the invention is characterized in that the circuit also comprises a pulse reduction circuit connected to the clock pulse generator for reducing to a predetermined valve the number of times per field period that the content of the storage element is changed under the influence of clock pulse applied to the sawtooth generator.

Due to this measure, the field deflection circuit does not include a control circuit so that any change is passed on without significant delay, while the amplitude of the sawtooth-shaped signal remains unchanged. Preferably, the pulse reduction circuit is adapted to omit a number of clock pulses and to apply the remaining clock pulses to the sawtooth generator.

The circuit is in this case advantageously characterized in that the pulse reduction circuit is in the form of a rate multiplier for substantially regularly distributing the clock pulse applied to the sawtooth generator during the field period. A better approximation of the sawtooth for use in a field deflection circuit is then obtained. As will be explained hereinafter, such a rate multiplier is a known circuit which, however, has hitherto not been used in the television technique.

Since clock pulses are omitted, a perturbation is produced. This will give little rise to, a visible interference if, according to a further characteristic feature of the invention, the frequency of the clock pluses is an integral multiple of the line frequency.

The said predetermined number is suitably chosen so that it is smaller than a number which corresponds to the lowest number of lines per field period in the signal for which the picture display device is suitable.

BRIEF DESCRIPTION OF THE DRAWINGS

The invention will now be described in greater detail by way of example with reference to the accompanying drawings, in which.

DETAILED DESCRIPTION OF THE INVENTION

Figure 1:
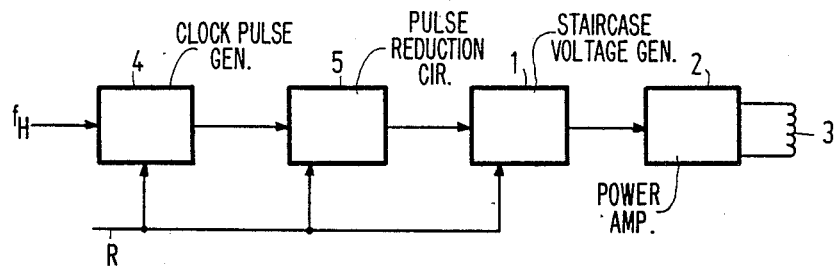
FIG. 1 is a block-schematic diagram of a field deflection circuit according to the invention.

In FIG. 1, the reference numeral 1 denotes a staircase voltage generator. The staircase-shaped voltage generated thereby is applied to a power amplifier 2 which converts this voltage into a current. A field deflection coil 3 through which the the field deflection current flows is connected to an output of amplifier 2. Amplifier 2 is formed in known manner as a linear amplifier, particularly due to the use of negative feedback. Consequently, the field deflection current has a shape which is substantially equal to the staircase-shaped output signal of generator 1. However, if the number of steps in the staircase is large, the current varies substantially linearly, more specifically due to the integrating action of the amplifier which behaves as a low-pass filter, and of the deflection coil. If the number of steps is sufficiently large, so that the height of each step is small as compared with the total amplitude of the staircase, the voltage of generator 1 may be considered as an essentially sawtooth-shaped voltage.

For generating the voltage, generator 1 receives clock pulses which are generated by a clock pulse generator 4. The number of clock pulses applied to generator 1 is maintained at a given value by a pulse reduction circuit 5 in a manner to be explained hereinafter. The output of circuit 5 is connected to the input of generator 1. Line pulses of the signal presented to the picture display device of which the circuit of FIG. 1 forms part are applied to generator 4 for synchronizing the clock pulses. Field pulses R are applied to generator 4, circuit 5 and generator 1 for their resetting. The line and field pulses may be the pulses which are present in the incoming signal and which are obtained by means of a synchronizing signal separator of known type. In a different manner, the pulses may originate from a line or field synchronizing circuit with which interference-free signals are obtained in known manner which are substantially synchronous with the corresponding incoming signals. Each clock pulse applied to generator 1 causes a given variation of the signal of the generator and there is no variation in the time interval between two successive clock pulses. The desired staircase-shaped signal is produced in this manner. The field pulse causes a variation in the opposite direction so that the signal level assumes substantially the same value as at the occurrence of the previous field pulse. Generator 1 is adapted in such a manner that the variation caused upon the occurrence of each clock pulse has a constant value. In this way, the amplitude of the generated staircase is only dependent on the number of clock pulses per field period. Generator 1 comprises, for example, a capacitor each time receiving a constant charge so that the voltage across the capacitor increases, the capacitor being subsequently discharged by the field pulse.

However, if the number of clock pulses per field period is not constant, the amplitude of the staircase and consequently the height of the picture shown on a display screen (not shown in FIG. 1) is not constant. This is very undesirable. A constant number of clock pulses per field period could be obtained by coupling the clock pulse frequency with the field frequency. The field frequency, however, may have different values, for example, 50 Hz. according to the European television broadcasting standard or 60 Hz in the U.S.A. The clock pulse frequency should thus be switchable under the influence of a field frequency detection circuit. Moreover, the clock pulse generator should be incorporated in a control loop for controlling the frequency of the generator in dependence upon a detected difference between the incoming field frequency and a frequency which would be derived from that of the generator. In view of the low value of the field frequency, such a control would be very impractical.

The clock pulse frequency in the circuit of FIG. 1 is derived from and synchronized with the incoming line frequency $f_H$ and may therefore have difference values. $f_H$ is, for example 15.750 kHz for the American standard, 15.625 kHz. for the European standard and 31.250 kHz. for a high-resolution system with 1250 lines per picture and a field frequency of 50 Hz. The clock pulses of generator 4 may have the line frequency or a lower frequency. A higher frequency which is an integral multiple of the line frequency will preferably be chosen for obtaining a staircase approximating the sawtooth shape as much as possible. In the embodiment described, a frequency is chosen which is 12 times higher than frequency $f_H$ and which is derived from the teletext clock present in the picture display device. In the absence of circuit 5, the level of the signal of generator 1 would then vary by a number of 12 times per line period, i.e. $12 \times 312.5 = 3750$ times per field period of 20 ms for the European standard, $12 \times 262.5 = 3150$ times per field period of 16.7 ms for the American standard and $12 \times 625 = 7500$ times per field period of 20 ms for the above-mentioned high-resolution system. These figures are reduced by means of circuit 5 and this in such a manner that the number of clock pulses applied per field period to generator 1 is constant, that is to say, having a predetermined value which is independent of the number of lines per field period. If the number of clock pulses generated by generator 4 is larger than the value m, circuit 5 suppresses the superfluous clock pulses. The remaining clock pulses are transferred to generator 1. However, a condition is that the number m should be smaller than the lowest line number to be expected, multiplied by 12. In the embodiment described, a minimum of 250 lines per field is chosen, that is to say, a minimum of $m = 12 \times 250 = 3000$ clock pulses per field period. This implies that for the three television systems considered, $3750 - 3000 = 750$, $3150 - 3000 = 150$ and $7500 - 3000 = 4500$ clock pulses, respectively, are omitted.

The pulse reduction circuit 5 may be formed such that all incoming clock pulses are passed on until the number me is reached, whereafter no clock pulse is passed any longer until the next field pulse occurs. The desired amplitude is then reached after the m passed clock pulse, whereafter the level of the signal generated by generator 1 remains unchanged until the end of the field period. In most cases, however, such a signal cannot be used for the field deflection. For this reason the clock pulses suppressed by circuit 5, i.e. 1 out of 5 in the first case considered, 1 out of 21 in the second case and 3 out of 5 clock pulses in the third case are distributed over the entire field period as regularly as possible. In this way it is ensured that the maximum of the staircase is reached at the end of the field period and in that the staircase is an optimum approximation of the sawtooth. The perturbation caused by the suppression is then minimized. In all cases, that is to say, independent of the line number per field period and of the duration of this period, the signal of generator 1 has a staircase shape with m vertical steps and occasionally with a horizontally extended step. If there is a switch-over after reception of a signal with a given field period, to a signal with a different field period, the m steps are now distributed over a different duration than before hand so that the sawtooth has a different slope. This is obtained substantially without any time delay.

Since the sawtooth is approximated by a staircase, a high frequency perturbation is introduced. In the case of the minimum m, that is to say, if no clock pulses are omitted, there are m identical steps per field period. The frequency of the perturbation is thus m times as high as the field frequency. With m=3000, this frequency is equal to $3000 \times 50 = 150$ kHz. for the European standard. If $h-m$ clock pulses are regularly omitted per field, an additional perturbation at a frequency which is equal to $h-m$ times the field frequency is produced. In this case, h is the number of clock pulses generated per field period by generator 4. In the example described, it holds that $h = 3750$ for the European standard and the additional perturbation thus has a frequency which is equal to $750 \times 50 = 37.5$ kHz. For the American standard, the perturbations have the respective frequencies of $3000 \times 60 = 180$ kHz. and $150 \times 60 = 9$ kHz and for the high-resolution system the corresponding figures are 150 kHz. and 225 kHz. As compared with the field frequency, the frequencies are so high that the perturbations have little influence on the operation of amplifier 2 and on the field deflection current. It is also evident from the foregoing that a maximum possible value of h and hence of the clock pulse frequency and a minimum possible value of m are important. The figures found will be slightly less favorable if the above-assumed regularity is not exactly achieved.

In the foregoing, the field period has always been referred to, that is to say, no allowance has been made for the fact that the generated essentially sawtooth-shaped signal has a retrace which is not infinitely short. It is therefore more correct to use the term field trace period, i.e. the period of approximately 19 ms for the European standard which is required for vertical visible scanning of the display screen. This means that the constant number m of steps is distributed over the field trace period.

In the described embodiment of the circuit according to the invention, a clock pulse frequency is used which is an integral multiple of the line frequency. This is not necessary. The chrominance sub-carrier frequency, which is a non-integral multiple of the line frequency or a frequency, derived therefrom, may be chosen alternatively. Since the number m of the clock pulses actually contributing to the sawtooth generation is constant, the number h and hence the clock pulse frequency do not even have to be constant. The only condition imposed on this frequency is that a possible variation thereof, for example as a result of noise, temperature effects or video recorder tape stretch does not give rise to an impermissible variation of the amplitude of the generated sawtooth.

Figure 2:
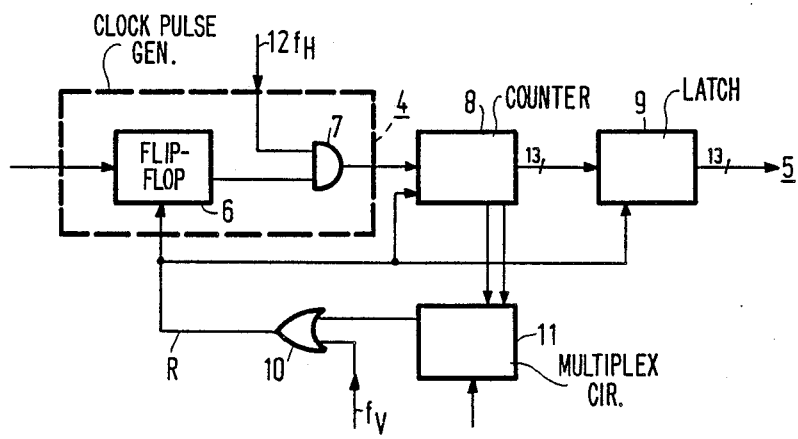
FIGS. 2, 3, 4 and 5 show more detailed diagrams of parts of the diagram of FIG. 1.

FIG. 2 shows an embodiment of pulse generator 4. A flip-flop 6 receives a pulse originating from the field synchronizing circuit and occurring a certain time, for example 12.5 line periods, after the commencement of the field period. This pulse indicates the commencement of the field trace period. Flip-flop 6 is reset at the end of the field period. A pulse whose duration correspond to that of the field trace and which is applied to an AND gate 7 for keeping this gate open, is present at an output of flip-flop 6. Clock pulses whose repetition frequency is 12 times the line frequency $f_H$ and which originate form the line synchronizing, circuit are also applied to gate 7. The output signal of gate 7 is also the output signal of generator 4. It comprises the clock pulses occurring during the field trace period. These clock pulses are counted by a 13-bit counter 8 for circuit 5. Counter 8 is reset at the end of the field period while the content of the counter 8 is taken over by a latch 9. If the content of counter 8 does not change, the number available at the output of latch 9 does not change either, i.e. the umber h expressing how many clock pulses have occurred during the field trace period.

If one or more field pulses are not present for some reason or other, for example, owing to interferences, a sawtooth-shaped field signal must still be generated in order to prevent damage to the picture display tube. For this purpose, the generator of FIG. 2 has an OR gate 10 and a multiplex circuit 11. A field pulse originating from the field synchronizing circuit and occurring at the commencement of the field retrace period is applied to an input of gate 10. The output signal of circuit 11 is present at another input of gate 10. The outputs of counter 8 having the two most significant bits and the second most significant bit are connected to two inputs of the circuit 11 in which a choice is made between these two bits by means of a signal which originates from the control section of the picture display device and which indicates the value of the line frequency. If the field pulse is present, it is applied via gate 10 to elements 6, 8 and 9 so that the number h is made available. In this case h has the value which corresponds to the number of lines per field trace, for example $(312.5 - 12.5) \times 12 = 3600$ for the European standard. If there is no field pulse, counter 8 continues to count. If the line frequency $f_H$ has the value of 15.625 kHz (European standard) or 15.750 kHz (American standard), the second most significant bit of counter 8 is chosen by circuit 11 and is passed on to gate 10. Flip-flop 6 and counter 8 are reset by this bit so that the new bit h has the value $2^{12} = 4096$. This value corresponds to the free running frequency of $(15.625 \times 12): 4096 = 45.8$ Hz which is lower than the lowest field frequency to be expected, for example, the nominal field frequency of 50 Hz in accordance with the European standard, which brings about a fast lock-in as soon as the field pulse is present again. If frequency $f_H$ has the value of 31.250 kHz (high resolution system) the most significant bit of counter 8 is applied by means of circuit 11 to gate 10 for resetting flip-flop 6 and counter 8. In this case h has the value $2^{13} = 8192$ and the free running frequency of the sawtooth generator has the value $(31,250 \times 12): 8192 = 45.8$ Hz, hence the same value as mentioned hereinbefore.

If the picture display device of which the circuit of FIG. 1 forms part is suitable for receiving and processing a signal in accordance with one or more given picture display systems, the number of clock pulses that has to be suppressed by the pulse reduction circuit 5 is known in advance. Circuit 5 may thus be designed for regularly suppressing the superfluous pulses, i.e. every sixth pulse in the example of the European television broadcasting standard. If the display systems are not known in advance and if the circuit of FIG. 1 is to be universal, circuit 5 must be capable of realizing a distribution of the suppressed pulses which is as regular as possible, irrespective of the number h.

Figure 3:
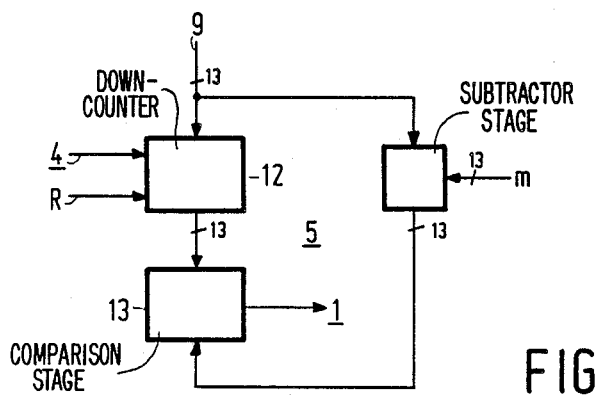

In the embodiment of FIG. 3, circuit 5 includes a down-counter 12 which receives the number h determined by the circuit of FIG. 2. Under the influence of the clock pulses at the frequency 12 $f_H$, counter 12 counts from h to zero and is reset by the field signal R of gate 10. Consequently, a series of binary digits is generated which is applied to a comparison stage 13. The number h is also applied to an input of a subtractor stage 14. The chosen number m is present in a digital form at another input of stage 14 and, with the aid of stage 14, the difference $w = h - m$ is calculated which indicates how many clock pulses are omitted per field period. The number w is the input number of comparison stage 13. The comparison is effected by means of this stage in such a manner that the sequence of significance of the number present at the outputs of counter 12 is reversed. This means that the most significant bit is interchanged by the least significant bit, while the second most significant bit is interchanged with the next to least significant bit, and so forth. The number whose reversal is larger than the number w gives rise to an output signal of stage 13 to be applied to sawtooth generator 1. A series of pulses with a certain regularity is obtained thereby. Such a reversal is known per se, namely from U.S. Pat. No. 3,836,908. The result of this method is, however, not ideal. This will be apparent from a numerical example in which, for the sake of simplicity, h is chosen to be 31 and m is chosen to be 5. Due to the reversal, for example the number 10110, i.e. 22 in decimal notation, is replaced by the number 01101, i.e. 13 in decimal notation. Since 13 is smaller than $w = 26$, no clock pulse is applied to generator 1. It is found that a distribution is obtained with clock pulses at the positions 31, 27, 23, 25 and 7 of the output signal of counter 12. Between the first two pulses 3 pulses are suppressed, between the next two pulses also 3 and between the subsequent two pulses 7 and then 7 and once more 7.

Figure 4:
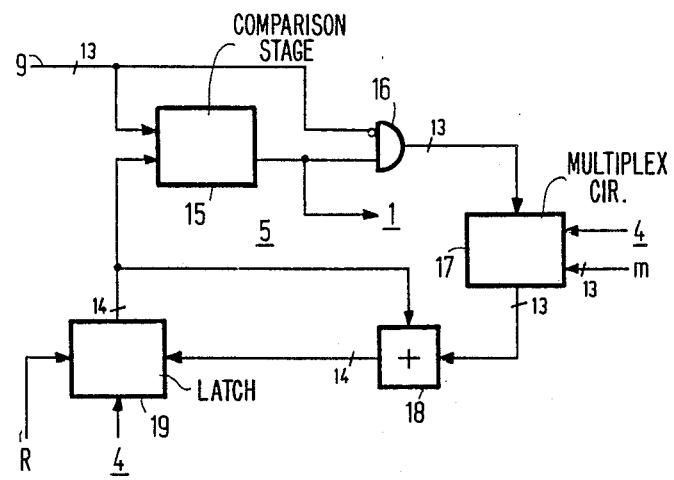

A more regular distribution is obtained with the circuit of FIG. 4. The number h determined by generator 4 is applied to a first input of a comparison stage 15 and via a reversal to an input of an AND-gate 16, another input of which is connected to an output of stage 15. An output of gate 16 is connected to an input of a multiplex circuit 17. The chosen number m is present in digital form at another input of circuit 17. Under the influence of the clock pulse signal at the frequency $12 f_H$, a choice is made between the two input information components by means of circuit 17. The information chosen is applied to an input of an adder stage 18. Another input information of stage 18 is the information of a latch 19 which is also applied to a second input of stage 15. The output information of gate 18 is applied to the latch 19 which also receives the clock pulse signal of generator 4. The output signal of stage 15 is also the output signal of the circuit of FIG. 4 and it is applied to generator 1.

If comparison stage 15 ascertains that the contents n of latch 19 is smaller than the number h, a logic 0 is present at the output of stage 15 and consequently also at the output of gate 16. Circuit 17 passes nothing in the first half of a period of the clock signal and it passes the number m in the second half. At the start of a new clock period, the content of latch 19 is equal to the previous content n plus the number m. The same cycle is performed several successive times in which the value of the number n is each time increased, more specifically until n has become equal to or larger than the number h. A logic 1 is then present at the output of stage 15, that is to say, a clock pulse is applied to generator 1, while gate 16 is opened so that the number −h is passed on to circuit 17. First this number and then the number m are present at the output of this circuit. The content of latch 19 which was n first becomes n−h and then n−h+m whereafter the cycle is repeated. Latch 19 is reset by the output signal R of gate 10 (FIG. 2). The reason for this measure is that a possibly visible perturbation owing to the omission of clock pulses whose frequency is an even multiple of $f_H$ is thereby the same for a given line and for the subsequent line upon interlaced display so that the interference pattern produced stands still and is thus not very troublesome.

With the numerical example already stated, i.e. for h=31 and m=5, successively 6, 5, 5, 5 and 5 pulses are suppressed in one period of 31 pulses among the pulses supplied by stage 15. This is indeed more regular than in the embodiment of FIG. 3. In a more realistic example in which h=3600 (European standard) and m=3000, thus in which w=600 clock pulses must be omitted, i.e. 1 out of 6, the following values are found for n and for the output of stage 15.

| 3000 | and | 0 |
|------|-----|---|
| 6000 |     | 1 |
| 5400 |     | 1 |
| 4800 |     | 1 |
| 4200 |     | 1 |
| 3600 |     | 1 |
| 3000 |     | 0 |
| 6000 |     | 1 etc. |

It is apparent that 1 out of 6 clock pulses is suppressed in a regular manner. Since n may be larger than h, latch 19 must contain one bit more than h, i.e. 14.

It will be noted that the circuits of FIGS. 3 and 4 are examples of circuits for generating pulses with almost equal intervals in between under the influence of binary codes. Such circuits are known under the name of rate multipliers and are described in the literature for interpolative digital-to-analog conversion, for example in the American publication "IEEE Transactions on Communications", Vol. COM-22, No. 11, November 1974, pages 1797 to 1806. An example of such a circuit is also described in "Philips Data Handbook, Electronic components and materials, Integrated circuits, Book IC04", 1986, pages 539 to 546, type number HEF4527B. It is apparent from FIG. 4 on page 545 that a number of pulses preprogrammed from a given number of pulses is passed on. This circuit is used for arithmetic operations. It will be evident that a choice may be made from these circuits for use as a pulse reduction circuit in the field deflection circuit according to the invention. The circuit described with reference to FIG. 4 is preferred in view of the more regular distribution of the output pulses. It will also be noted that in the circuit of FIG. 2 the components 8 and 9 operate as analog-to-digital converters, namely for converting the analog pulses at the output of gate 7 into the digital number h which is applied to the pulse reduction circuit 5. It will thus be evident that other known analog-to-digital converters can be used for the same purpose.

Figure 5:
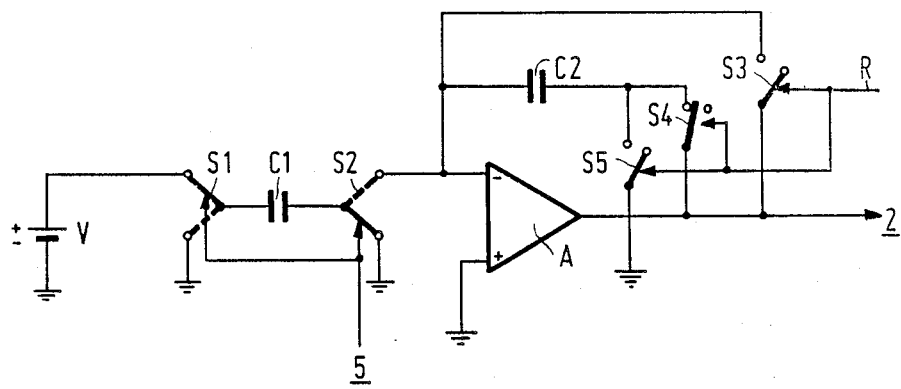

Any known type may be used as a staircase voltage generator 1. FIG. 5 shows a preferred embodiment of this generator which is a circuit with switched capacitors. The circuit comprises two capacitors, C1 of approximately 0.1 pF, and C2 of approximately 200 pF which are both integrated in a semiconductor body comprising all components of the deflection circuits of FIG. 1 with the exception of capacitors having a large capacitance and possibly elements having a large dissipation in circuit 2, and with the exception of coil 3. The terminal of capacitor C1 shown on the left may be connected via a switch S1 either to a DC voltage source V or to ground, and the terminal of the capacitor C1 shown on the right can be connected either to ground or to an inverting input terminal of an amplifier A a non-inverting input terminal of which is connected to ground. A connection terminal of capacitor C2 is connected to the said inverting input terminal. The other terminal of the capacitor C2 may be connected to an output terminal of amplifier A via a switch S4 and to ground via a switch S5. Finally a switch S3 is arranged between the inverting input terminal and the output terminal of amplifier A.

Switches S1 and S2 are operated by the clock pulses from circuit 5. During the first half of a clock period, in which period capacitor C1 is connected to source V at one end and to ground at the other end, capacitor C1 is charged under the voltage of source V and during the second half of the period, in which switches S1 and S2 are in the other position, capacitor C1 is discharged while the charge stored therein is transferred to capacitor C2. For this purpose switch S4 conducts while switches S3 and S5 are blocked. In this way an essentially linearly varying voltage with a decreasing variation is produced at the output of amplifier A. At the end of the field period switches S3, S4 and S5 are changed over under the influence of the field reset pulse R from gate 10 and this in such a manner that switches S3 and S5 conduct while switch S4 is blocked. Capacitor C2 is discharged by the output of amplifier A. Thanks to switches S3 and S4, an offset voltage which may be present at the output terminal of amplifier A has no influence on the level of the essentially sawtooth-shaped voltage produced, which level is assumed at the end of discharging capacitor C2. This level is determined by the potential with which switch S5 is connected, i.e. that of ground in the embodiment of FIG. 5.

The capacitances of capacitors C1 and C2 being denoted by $C_1$ and $C_2$, respectively, the charge of capacitor C1 is equal to $Q_1 = C_1 V$. V is the value of the voltage of the source V. The charge $Q_2 = C_2 V'$ of capacitor C2 is equal to $mQ_1 = mC_1 V$. It is apparent therefrom that the voltage V' across capacitor C2 is equal to $$m \frac{C_1}{C_2} V$$

and is thus proportional to the ratio of the capacitances of two integrated capacitors, which is accurate. The amplitude of the generated sawtooth is thus accurately determined if voltage V is constant and if the number m is fixed. The output of amplifier A or the connection of capacitor C2 shown on the right is connected to the power amplifier 2.

An embodiment in which clock pulses are suppressed for obtaining the correct amplitude has been chosen in the foregoing. Another possibility is to transfer all h generated clock pulses for which the circuit is adapted such that m clock pulses give rise to storage of information and that $w = h - m$ clock pulses distributed in the manner described do not give rise to storage of information. When the m pulses occur, the content of a storage element, i.e. capacitor C2 in FIG. 5, is thus each time changed, that is to say a logic 1 is transferred. However, when the w pulses occur, the content of the storage element remains unchanged, that is to say a logic 0 is transferred.

What is claimed is:

1. A circuit for the field deflection in a picture display device suitable for receiving and processing a signal comprising line and field pulses, said field deflection circuit comprising a sawtooth generator, a power amplifier coupled to the sawtooth generator, a field deflection coil connected to an output of the amplifier, and a clock pulse generator for applying clock pulses to the sawtooth generator, said sawtooth generator, for generating an essentially sawtooth-shaped signal, being provided with a storage element for storing information under the influence of applied clock pulses and having reset means for resetting the storage element under the influence of field pulses, characterized in that the circuit also comprises a pulse reduction circuit connected to the clock pulse generator for reducing to a predetermined value the number of times per field period that the content of the storage element is changed under the influence of said clock pulses applied to the sawtooth generator.

2. A field deflection circuit as claimed in claim 1, characterized in that the pulse reduction circuit is adapted to omit a number of clock pulses and to apply the remaining clock pulses to the sawtooth generator.

3. A field deflection circuit as claimed in claim 2, in which a counter is connected to the clock pulse generator for determining the number of clock pulses generated per field period, characterized in that a storage element is connected to the counter for storing, for one field period, the number h established by the counter of the clock pulses generated per field period by the clock pulse generator.

4. A field deflection circuit as claimed in claim 2, characterized in that the pulse reduction circuit is in the form of a rate multiplier for substantially regularly distributing the clock pulses applied to the sawtooth generator during the field period.

5. A field deflection circuit as claimed in claim 3, characterized in that the pulse reduction circuit comprises a down-counter connected to the storage element for counting from the number h to zero, and a subtractor stage for subtracting the predetermined value m from the number h, and a comparison stage for comparing the result of the subtraction with the count of the down-counter whose significance is reversed, the comparison stage reversed count is larger than the subtraction result.

6. A field deflection circuit as claimed in claim 3, characterized in that the pulse reduction circuit comprises a comparison stage connected to the storage element for comparing the number h with the content n of a memory which receives the clock pulses generated by the clock pulse generator, in which said content becomes $n + m$ after one clock pulse period if n is smaller than h, while no clock pulse is applied to the sawtooth generator, and in which, in the opposite case, said content becomes $n - h + m$ after one clock pulse period, while a clock pulse is applied to the sawtooth generator.

7. A field deflection circuit as claimed in claim 1, in which a counter is connected to the clock pulse generator for determining the number of clock pulses generated per field period, characterized by a gate for passing a field pulse generated by the counter for resetting the clock pulse generator and the sawtooth generator in the absence of a received field pulse, the occurrence of the generated field pulse corresponding to a frequency which is lower than the lowest field frequency in the signal for which the picture display device is suitable.

8. A field deflection circuit as claimed in claim 1 characterized, in that the frequency of the clock pulses is an integral multiple of the line frequency.

9. A field deflection circuit as claimed in claim 7, characterized in that the field pulse generated by the counter is also a reset pulse for the memory.

10. A field deflection circuit as claimed in claim 1, characterized in that the clock pulse generator has a gate for passing the generated clock pulse during the field trace period and for suppressing said pulses during the field retrace period.

11. A field deflection circuit as claimed in claim 1, characterized in that said predetermined number is smaller than a number which corresponds to the lowest number of lines per field period in the signal for which the picture display device is suitable.

12. A field deflection circuit as claimed in claim 1 in the form of a semiconductor body, characterized in that all said elements of the circuit are integrated in the semiconductor body, with the exception of capacitors having a large capacitance, elements having a large dissipation and the field deflection coil.

* * * * *